(12) United States Patent
Noda

(10) Patent No.: US 8,819,929 B2
(45) Date of Patent: Sep. 2, 2014

(54) COMPONENT MOUNTING METHOD

(75) Inventor: Kazuhiko Noda, Fukuoka (JP)

(73) Assignee: Panasonic Corporation, Osaka (JP)

( * ) Notice: Subject to any disclaimer, the term of this patent is extended or adjusted under 35 U.S.C. 154(b) by 679 days.

(21) Appl. No.: 12/617,058

(22) Filed: Nov. 12, 2009

(65) Prior Publication Data

US 2010/0122455 A1    May 20, 2010

(30) Foreign Application Priority Data

Nov. 20, 2008 (JP) ................................ P2008-296350

(51) Int. Cl.
*H05K 3/30* (2006.01)
*H01L 21/67* (2006.01)

(52) U.S. Cl.
CPC .................. *H01L 21/67144* (2013.01)
USPC .................. 29/832; 29/840; 29/740

(58) Field of Classification Search
USPC ........... 29/740–743, 832–834, 840–842, 705, 29/721; 228/1.1, 2.1, 8, 49.5; 414/752.1; 901/45–47
See application file for complete search history.

(56) References Cited

U.S. PATENT DOCUMENTS

| | | | |
|---|---|---|---|
| 5,894,657 A * | 4/1999 | Kanayama et al. | 29/740 |
| 6,389,683 B1 * | 5/2002 | Mori et al. | 29/740 |
| 6,467,670 B2 * | 10/2002 | Higashi et al. | 228/1.1 |
| 7,007,377 B2 * | 3/2006 | Noda et al. | 29/833 |
| 7,712,652 B2 * | 5/2010 | Morita et al. | 228/180.22 |
| 7,797,820 B2 * | 9/2010 | Shida et al. | 29/740 |
| 7,827,677 B2 * | 11/2010 | Ueno et al. | 29/740 |
| 8,151,451 B2 * | 4/2012 | Noda | 29/739 |
| 8,220,787 B2 * | 7/2012 | Noda | 269/21 |

FOREIGN PATENT DOCUMENTS

| | | | |
|---|---|---|---|
| JP | 2001-015533 A | | 1/2001 |
| JP | 2004-281717 A | | 10/2004 |
| JP | 2007-129130 A | | 5/2007 |
| JP | 2009135366 | * | 6/2009 |

* cited by examiner

*Primary Examiner* — Minh Trinh

(74) *Attorney, Agent, or Firm* — Pearne & Gordon LLP

(57) ABSTRACT

A component mounting method for mounting a plurality of types of components on a substrate is disclosed. The mounting method includes providing a component mounting apparatus 1 for mounting a semiconductor chip 6a picked from a component feeding stage 3 to a substrate 7, having a paste coating unit 20 for squirting paste from an associated coating nozzle to apply the paste to the substrate 7, a paste transfer unit 54 for transferring paste by an associated transfer tool to the substrate 7, and a heating-press unit 57 for pressing the component loaded on the substrate 7 against the substrate 7 while heating the component. The mounting method also includes selecting a work unit from the paste coating unit 20, the paste transfer unit 54 and the heating-press unit 57, and equipping a second head 12 with the selected work unit.

1 Claim, 14 Drawing Sheets

COMPONENT MOUNTING METHOD

BACKGROUND OF THE INVENTION

1. Field of the Invention

The present invention relates to a component mounting apparatus and a component mounting method by means of which a component such as a semiconductor chip is picked out from a component feeding stage and subsequently mounted on a substrate.

2. Description of the Related Art

A component, such as a semiconductor chip, is picked from a component feeding stage and mounted on a substrate, such as a lead frame and a resin substrate. A variety of variations exist for such a mode of mounting a component, according to a difference among attitudes of loading a component, methods for bonding a component to a substrate, and mounting accuracies required of component characteristics. Therefore, according to a mounting mode, different functions are demanded of a component mounting apparatus that performs mounting operation for taking a component out of a component feeding stage and mounting the component on a substrate.

For instance, in relation to an attitude of loading a component, a semiconductor chip in a wafer state is held on a wafer sheet in a face-up attitude in which an active face of the chip is oriented upward. In order to mount the semiconductor chips on a substrate in a face down state, the semiconductor chip picked from the semiconductor wafer must be turned upside down. A component mounting apparatus intended for such a face down semiconductor chip has a component turning mechanism that turns upside down a semiconductor chip picked from a wafer. When an adhesive is used as a method for bonding a component, the component mounting apparatus must have a function for feeding an adhesive to a mount position on a substrate. Therefore, when the apparatus is intended for a plurality of types of components requiring different mounting modes, there is employed a component mounting apparatus equipped with functions conforming to the respective mounting modes (see; for instance, Patent Document 1). There is illustrated an example component mounting apparatus having a rotary mechanism that turns a pellet picked from a wafer stage upside down and a coating mechanism that applies a lead frame with an adhesive.

Patent Document 1: JP-A-2001-15533

Incidentally, in a current electronic device manufacturing field, it has become required to improve versatility of a production facility so that a wide range of component types, including a high-performance component requiring a high degree of component mounting accuracy, can be taken as subjects of work, in conjunction with a reduction in footprint and the number of facilities for the purpose of further enhancing productivity and quality. However, difficulty is encountered in sufficiently responding to these demands in the related-art technology disclosed in the foregoing patent document.

SUMMARY OF THE INVENTION

Accordingly, the present invention aims at providing a component mounting apparatus and a component mounting method that make it possible to enhance productivity as well as versatility.

A component mounting apparatus of the present invention has a component feeding stage supplying a component; a substrate holding stage holding a substrate; a first head that receives the component fed from the component feeding stage and that loads the component on a substrate held by the substrate holding stage; a second head that subjects the substrate or the component loaded on the substrate by the first head to predetermined operation; and a common head movement mechanism that moves the first head and the second head so as to alternately make access to a work position on the substrate. The second head can selectively be equipped with a work unit having at least one of a paste coating function for squirting paste for component bonding from a coating nozzle so as to supply the paste to the substrate, a paste transfer function for transferring paste by a transfer tool to supply paste to the substrate, and a heating-press function for pressing the component loaded on the substrate against the substrate while heating the component.

A component mounting method of the present invention is a component mounting method for mounting a plurality of types of components on a substrate by a component mounting apparatus comprising a component feeding stage supplying a component; a substrate holding stage holding a substrate; a first head that receives the component fed from the component feeding stage and that loads the component on a substrate held by the substrate holding stage; a second head that subjects the substrate or the component loaded on the substrate by the first head to predetermined operation; and a common head movement mechanism that moves the first head and the second head so as to alternately make access to a work position on the substrate, wherein, in accordance with the type of a component, the second head is selectively equipped with a work unit having at least one of a paste coating function of squirting paste for component bonding from a coating nozzle, to thus supply the paste to the substrate, a paste transfer function for transferring paste by means of a transfer tool, to thus supply paste to the substrate, and a heating-press function for pressing the component loaded on the substrate against the substrate while heating the component, thereby performing the predetermined operation.

According to the present invention, in addition to including the first head having a function of loading a component on a substrate held by a substrate holding stage, a component mounting apparatus is configured to have a second head for subjecting the substrate or the component loaded on the substrate by the first head to predetermined operation. Further, the component mounting apparatus is configured so as to be able to selectively provide the second head with a work unit having at least one of a paste coating function of squirting paste for component bonding from a coating nozzle, to thus supply the paste to the substrate, a paste transfer function for transferring paste by means of a transfer tool, to thus supply paste to the substrate, and a heating-press function for pressing the component loaded on the substrate against the substrate while heating the component. The single apparatus can thereby address a variety of mounting modes and enhance versatility and productivity.

DESCRIPTION OF THE PREFERRED EMBODIMENTS

Figure 1:
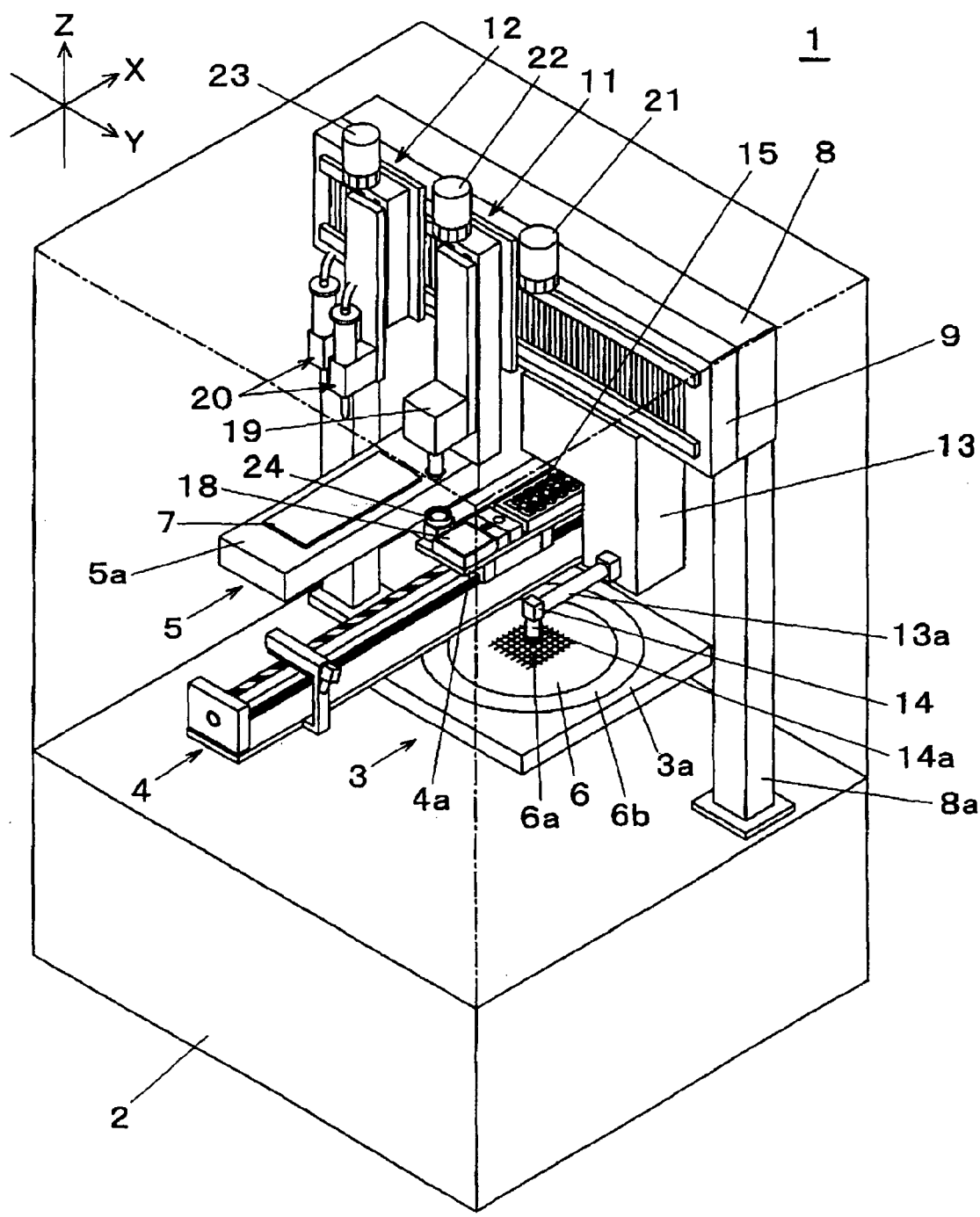
FIG. 1 is an overall perspective view of a component mounting apparatus of an embodiment of the present invention.
Figure 2:
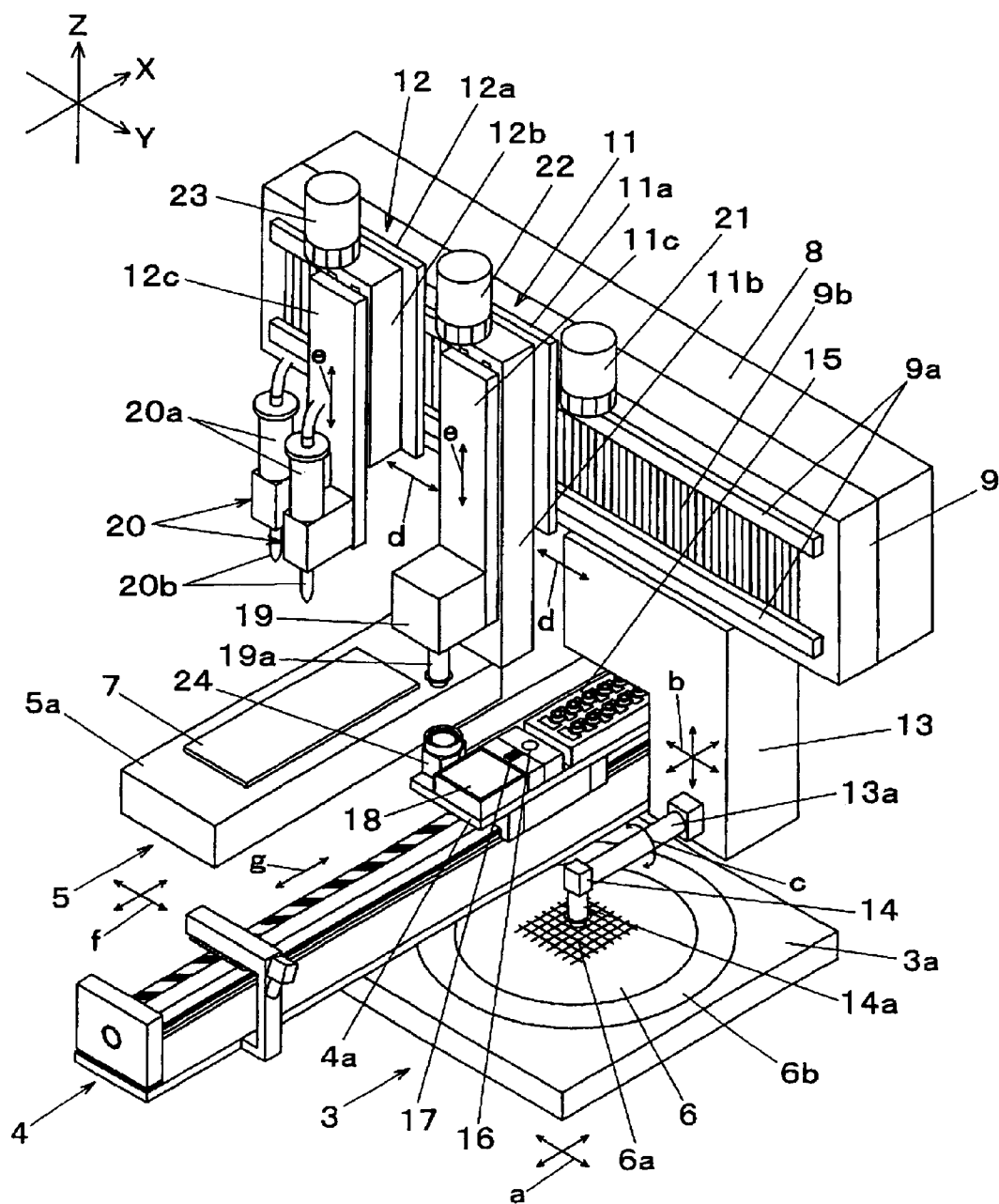
FIG. 2 is a partial perspective view of the component mounting apparatus of the embodiment of the present invention.
Figure 3:
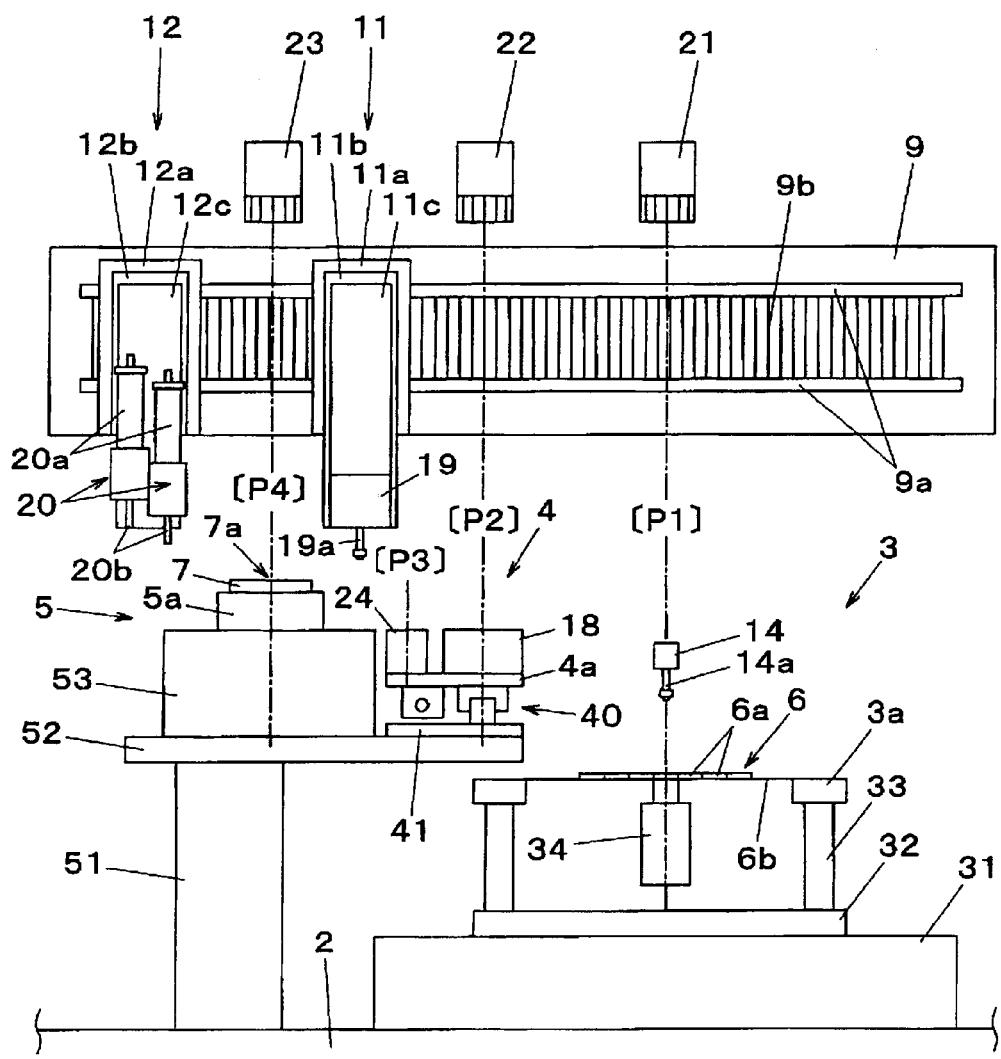
FIG. 3 is a front view of the component mounting apparatus of the embodiment of the present invention.
Figure 4:
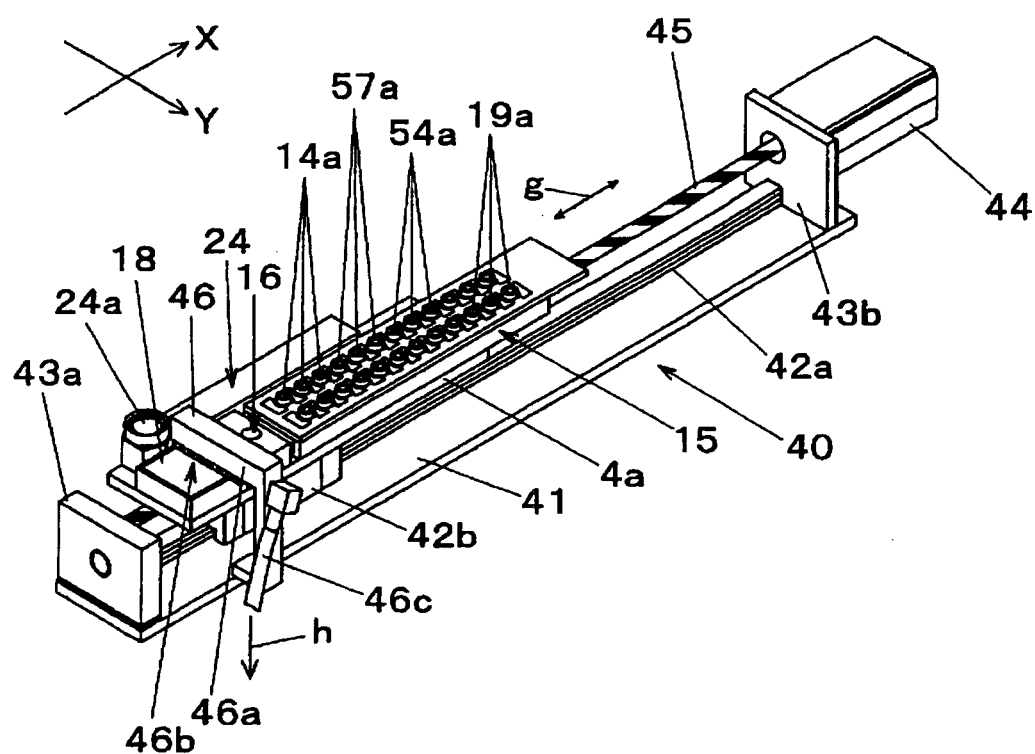
FIG. 4 is a perspective view of a unit collection stage of the component mounting apparatus of the embodiment of the present invention.
Figure 5:
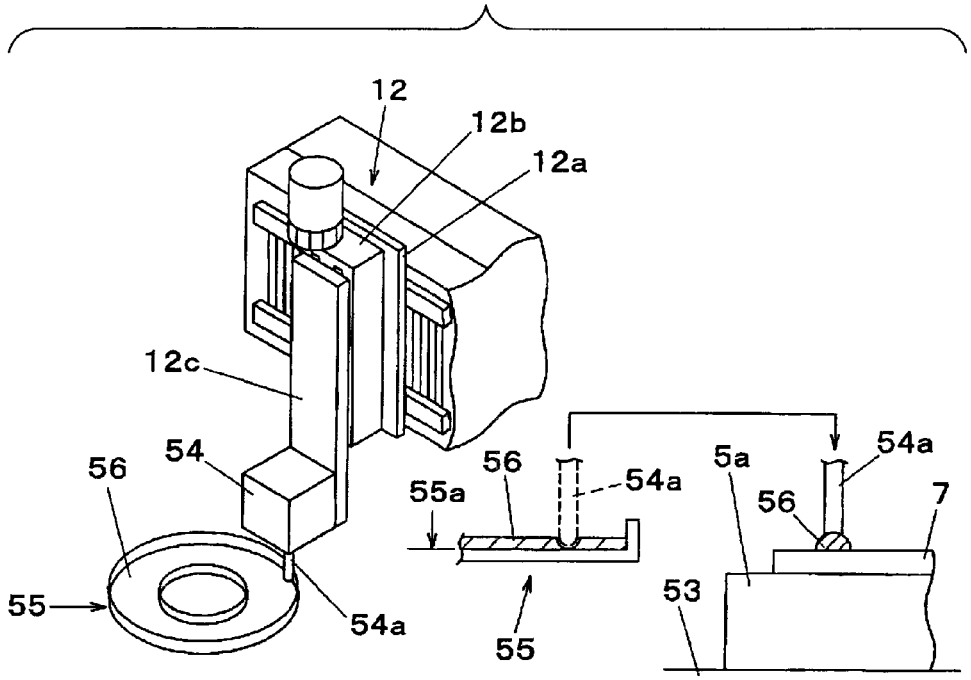
FIG. 5 is an explanatory view of a work unit attached to a second head of the component mounting apparatus of the embodiment of the present invention.
Figure 5:
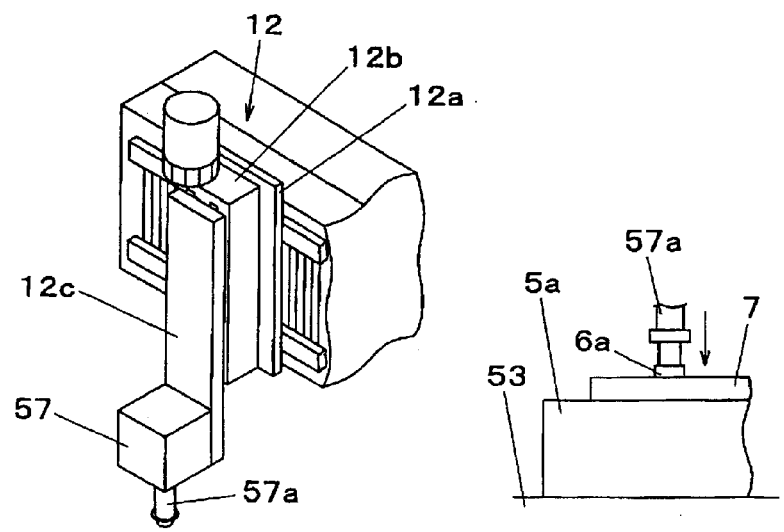
Figure 6:
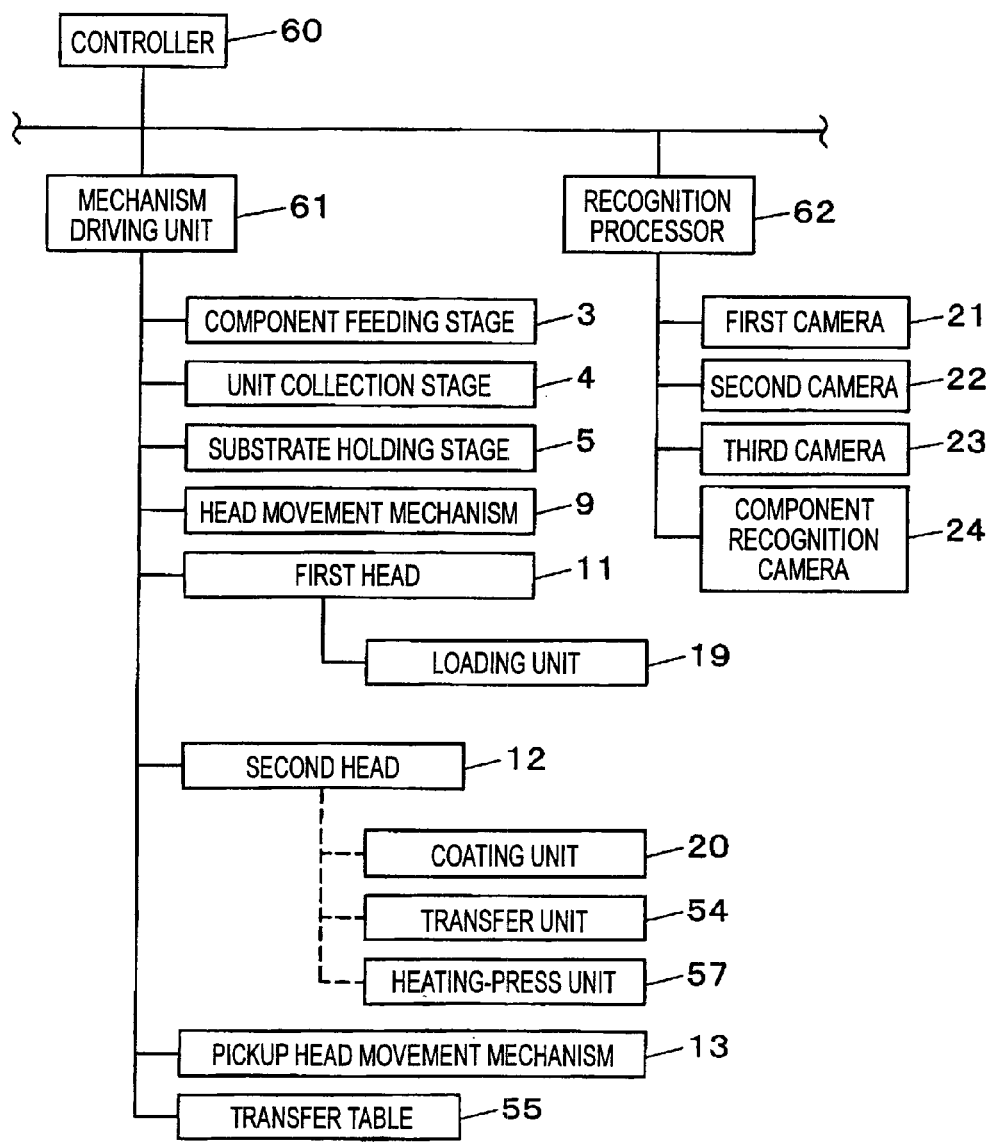
FIG. 6 is a block diagram showing the configuration of a control system of the component mounting apparatus of the embodiment of the present invention.
Figure 12:
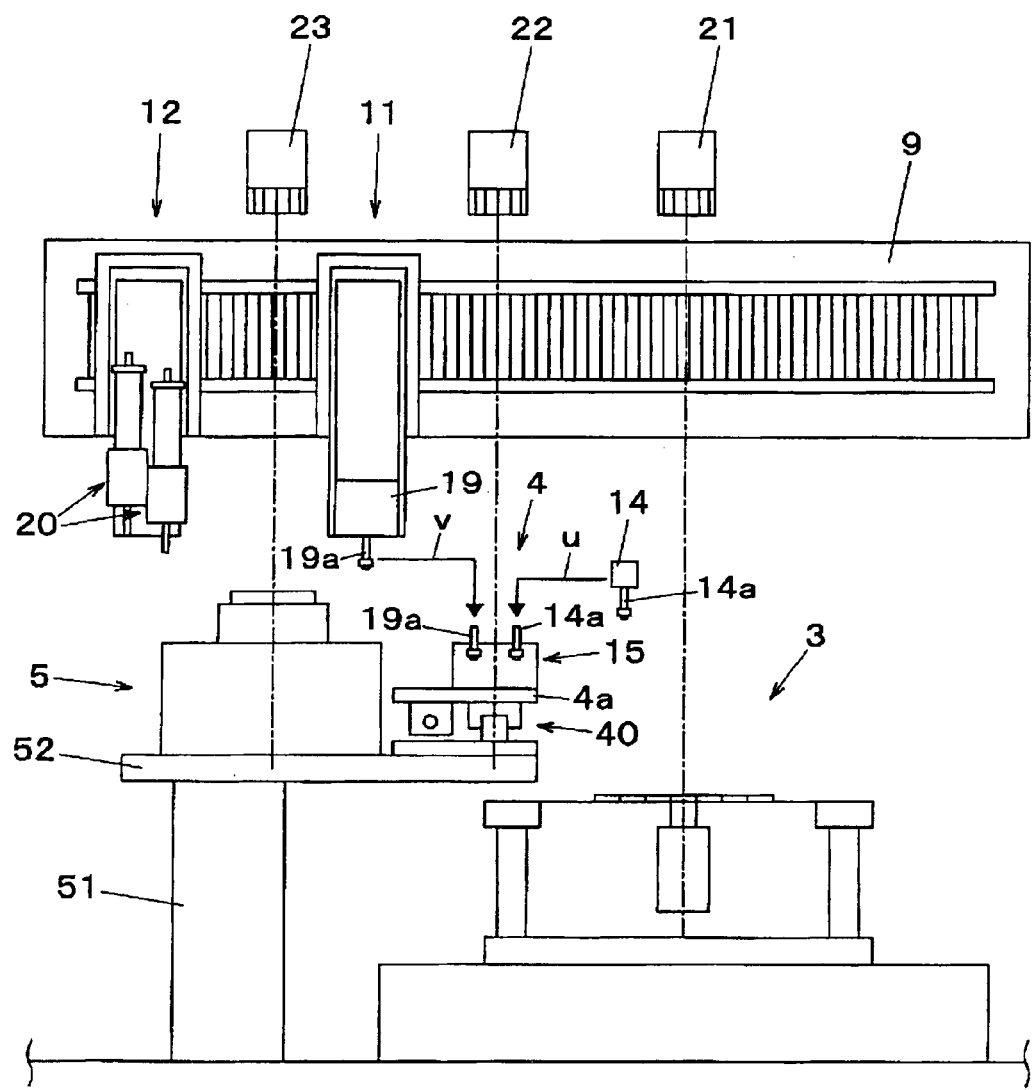
FIG. 12 is an operation explanatory view of tool replacement operation of the component mounting method of the embodiment of the present invention.
Figure 13:
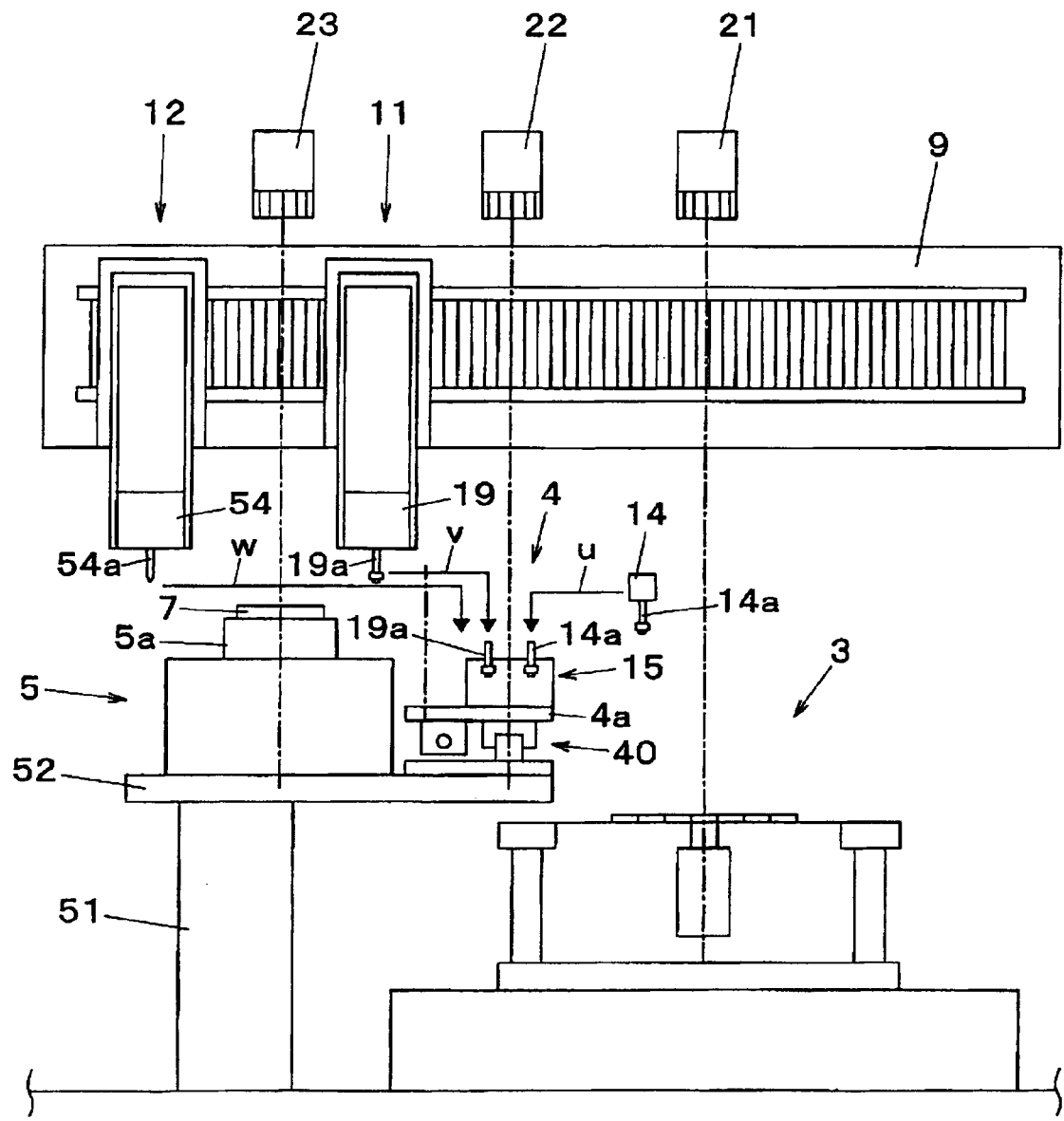
FIG. 13 is an operation explanatory view of tool replacement operation of the component mounting method of the embodiment of the present invention.
Figure 14:
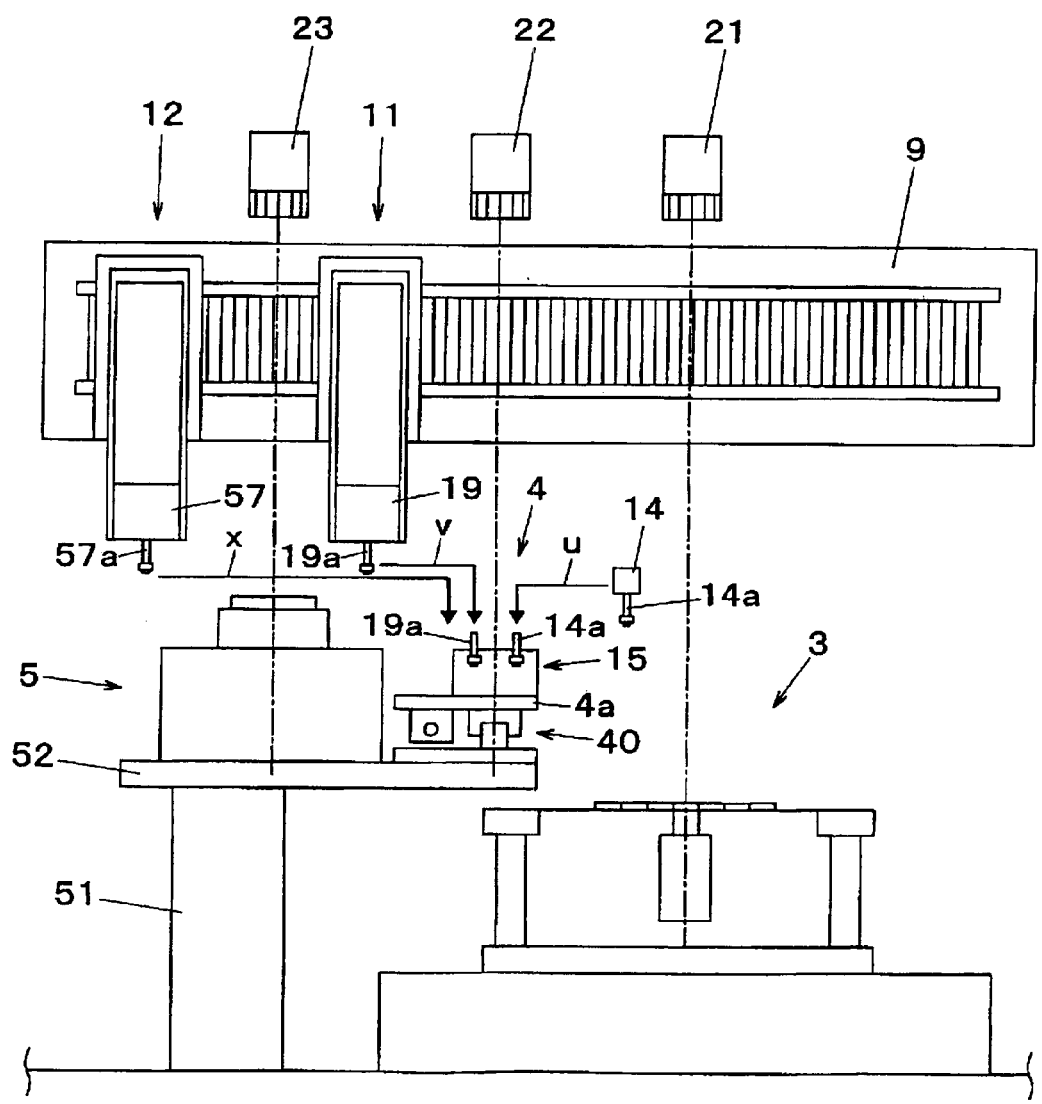
FIG. 14 is an operation explanatory view of tool replacement operation of the component mounting method of the embodiment of the present invention.

An embodiment of the present invention will now be described by reference to the drawings. FIG. 1 is an overall perspective view of a component mounting apparatus of an embodiment of the present invention; FIG. 2 is a partial perspective view of the component mounting apparatus of the embodiment of the present invention; FIG. 3 is a front view of the component mounting apparatus of the embodiment of the present invention; FIG. 4 is a perspective view of a unit collection stage of the component mounting apparatus of the embodiment of the present invention; FIG. 5 is an explanatory view of a work unit attached to a second head of the component mounting apparatus of the embodiment of the present invention; FIG. 6 is a block diagram showing the configuration of a control system of the component mounting apparatus of the embodiment of the present invention; FIGS. 7, 8, 9, 10, and 11 are process explanatory views showing a component mounting method of the embodiment of the present invention; and FIGS. 12, 13, and 14 are operation explanatory views of tool replacement operation of the component mounting method of the embodiment of the present invention.

First, an overall configuration of a component mounting apparatus 1 is described by reference to FIG. 1. The component mounting apparatus 1 has a function of mounting a component, such as a semiconductor chip, on a substrate by means of bonding. In FIG. 1, a component supply stage 3, a unit collection stage 4, and a substrate holding stage 5 are arranged on a bed 2 along a direction Y. A wafer holder table 3a provided in a component feeding stage 3 holds a semiconductor wafer 6 on which there are provided a plurality of semiconductor chips 6a that are components to be mounted. The unit collection stage 4 has a structure in which functional units, such as a tool stocker 15, a component recovery section 16, a calibration reference mark 17, a intermediate stage 18, and a component recognition camera 24, which will be described later, are collectively arranged on a movable table 4a that is moved back and forth in a direction X by means of a rectilinearly movable mechanism (an X-axis movement mechanism 40 shown in FIG. 4). A substrate holding stage 5 is configured so as to horizontally move a substrate holder table 5a holding a substrate 7 by means of an XY table mechanism 53 (see FIG. 3), and semiconductor chips 6a are mounted on a substrate 7.

A Y-axis frame 8 is situated above the component feeding stage 3, the unit collection stage 4, and the substrate holding stage 5 and along an edge of the bed 2 in its direction X and stretched along the direction Y while both ends of the Y-axis frame 8 are supported by support posts 8a. A head movement mechanism 9 that guides and drives a first head 11 and a second head 12, which will be described below, in the direction Y by means of driving operation of the linear motor is built into a front face of a Y-axis frame 8. The first head 11 is equipped with a loading unit 19 having a function of holding the semiconductor chip 6a and loading the chip on the substrate 7, and the second head 12 is equipped with a coating unit 20 having a function of applying an adhesive for bonding an electronic component to the substrate 7.

A first camera 21, a second camera 22, and a third camera 23 for ascertaining locations are disposed at positions above the component feeding stage 3, the intermediate stage 18, and the substrate holding stage 5. The first camera 21 captures an image of a semiconductor chip 6a to be picked up on the component feeding stage 3. The second camera 22 captures an image of the semiconductor chip 6a that is picked from the component feeding stage 3 and that is temporarily put on the intermediate stage 18 for positional correction. The third camera 23 captures an image of the substrate 7 held on the substrate holding stage 5, thereby ascertaining the location of a component mount point. A component recognition camera 24 disposed on the unit collection stage 4 captures from below an image of the semiconductor chip 6a picked from the component feeding stage 3.

Structures of individual sections will now be described by reference to FIGS. 2 and 3. The component feeding stage 3 has an XY table mechanism 31, and a plurality of support members 33 are disposed upright on a horizontal movement plate 32 fitted to an upper surface of the XY table mechanism 31. The support members 33 support the holder table 3a that holds the semiconductor wafer 6 placed on an upper surface of the holder table. The semiconductor wafer 6 has a structure in which the plurality of semiconductor chips 6a are affixed to a wafer sheet 6b in a predetermined pattern. In a face-up attitude of the wafer sheet 6b in which an active surface is oriented upward, the plurality of semiconductor chips 6a separated into pieces are held on and affixed to the wafer sheet.

A pickup operation position [P1] for picking up the semiconductor chip 6a from the semiconductor wafer 6 is set on the component feeding stage 3. The position of the first camera 21 corresponds to a pickup operation position [P1]. A result of imaging; namely, capture of an image of the semiconductor wafer 6 performed by the first camera 21, is subjected to recognition processing, whereby the position of a semiconductor chip 6a to be picked up is detected. An ejector mechanism 34 is placed at a location corresponding to the pickup operation position [P1] in the holding table 3a. The ejector mechanism 34 has a function of expediting removal of the semiconductor chip 6a from the wafer sheet 6b by projecting the semiconductor chip 6a from an undersurface side of the wafer sheet 6b with a pin. The ejector mechanism 34 is vertically moved when the semiconductor chip 6a is picked up so as to be brought into contact with the lower surface of the wafer sheet 6b. Thereby, a pickup head 14 to be described later can readily pick up the semiconductor chip 6a from the wafer sheet 6b.

During component pickup operation, the XY table mechanism 31 is driven, to thus horizontally move the wafer sheet 6b in the XY direction (as indicated by arrow "a"). Of the plurality of semiconductor chips 6a affixed to the wafer sheet 6b, a desired semiconductor chip 6a to be picked up is thereby placed at a pickup operation position [P1]. In an example illustrated herein, a wafer table that feeds components, in a wafer state, affixed to the wafer sheet 6b is used as the component feeding stage 3. However, a component tray for feeding a plurality of components in the form of a predetermined two-dimensional layout may also be placed on the component feeding stage 3 so as to be replaceable with a wafer table.

The pickup head 14 having a pickup nozzle 14a that holds the semiconductor chip 6a in a sucking manner is placed at a position above the component feeding stage 3. The pickup head 14 is held by a pickup arm 13a, and the pickup arm 13a is provided so as to extend to a position above the component feeding stage 3 from the pickup head movement mechanism 13 handing from the lower surface of the Y-axis frame 8. The pickup head drive mechanism 13 is driven, whereby the pickup arm 13a is moved in the directions X, Y, and Z (as indicated by an arrow "b") and rotates about an axis in the direction X (as indicated by an arrow "c").

The pickup head 14 is thereby moved in the direction Y at a position between the location above the component feeding stage 3 and the location above the unit collection stage 4 and moved back and forth in the direction X. The pickup head 14 thereby performs operation for picking up the semiconductor chip 6a from the component feeding stage 3 and moving the chip to the intermediate stage 18 provided on the unit collection stage 4. Further, when necessary, the pickup head 14 can be caused to recede from a position above the pickup operation position [P1] in the direction X. Moreover, the pickup head 14 is turned upside down by further rotating the pickup arm 13a, whereby the attitude of the semiconductor chip 6a held by the pickup nozzle 14a can be turned inside out (see FIG. 10).

As shown in FIG. 3, the unit collection stage 4 and the substrate holding stage 5 are provided on an upper surface of a base plate 52, and the base plate 52 is supported from below by a plurality of support posts 51 provided upright on the upper surface of the bed 2. A detailed structure of the unit collection stage 4 will now be described by reference to FIG. 4. In FIG. 4, the X-axis movement mechanism 40 has a function of moving the movement table 4a in the direction X and is made by placing on a base 41 mechanism elements to be described hereinbelow. A guide rail 42a is laid on an upper surface of the base 41 in the direction X, and the slider 42b slidably fitted to the guide rail 42a is fixed to a lower surface of the movement table 4a.

A feed screw 45 is supported by brackets 43a and 43b provided upright at respective ends of the base 41 and rotationally driven by a motor 44 held by the bracket 43b. The feed screw 45 is screw-engaged with a nut member (not shown) coupled to the lower surface of the movement table 4a. The motor 44 is rotationally driven in a forward or backward direction, whereby the movement table 4a moves back and forth in the direction X (as indicated by arrow "g"). The following function units disposed on the movement table 4a can be moved in an integrated fashion in the direction X, so that these function units can be situated at an area where the first head 11 and the second head 12 can gain access.

The tool stocker 15, the component recovery section 16, the calibration reference mark 17, the intermediate stage 18, and the component recognition camera 24 are collectively arranged on the movement table 4a. A plurality of work tools that are used, while being replaced according to a component type, such as the component holding nozzle 19a attached to the loading unit 19, are housed in the tool stocker 15 according to the type of a component. Work tools individually housed include the pickup nozzle 14a attached to the pickup head 14 and a transfer tool 54a and a heating-press tool 57a which are attached respectively to a transfer unit 54 and a heating-press unit 57 shown in FIG. 5. In a state where the tool stocker 15 is moved to the area where the first head 11 and the second head 12 can gain access, the first head 11 and the second head 12 are moved to the unit collection stage 4, whereby the component holding nozzle 19a, the transfer tool 54a, and the heating-press tool 57a that are attached respectively to the loading unit 19, the transfer unit 54, and the heating-press unit 57 can be replaced with a tool compliant with the type of a target component.

Specifically, the component mounting apparatus 1 illustrated in connection with the embodiment is configured in such a way that the tool stocker 15 is arranged at a position where both the first head 11 and the second head 12 can gain access, wherein the tool stocker 15 houses the component holding nozzles 19a attached replaceably to the loading unit 19 of the first head 11 according to the type of a target component, and work units attached selectively to the second head 12 according to the type of a target component; namely, the transfer tools 54a replaceably attached to the transfer unit 54 and the heating-press tools 57a replaceably attached to the heating-press unit 57. As a result of adoption of such a configuration, it is possible to make the apparatus compact by minimizing footprint of the mechanism section required of the tool replacement function even when there is a necessity for a plurality of replacement tools intended for a plurality of types of components.

The component recovery section 16 has a function of discarding and collecting a component that is determined to be inappropriate for being mounted on the substrate 7, such as a defective component and a mixedly-intruded component of different type, after having been picked from the component feeding stage 3. The calibration reference mark 17 is a reference mark provided for calibrating a mechanical position error, which would be caused by thermal expansion and contraction when the X-axis movement mechanism 40 is continually driven, by photographing an image of the error by means of the second camera 22 disposed at an elevated position.

The intermediate stage 18 is interposed between the component feeding stage 3 and the substrate holding stage 5 and provided integrally with the tool stocker 15. The semiconductor chip 6a picked from the component feeding stage 3 by means of the pickup head 14 is placed on the intermediate stage 18 for the purpose of positional correction. A relay position [P2] is set on the intermediate stage 18, and the second camera 22 is arranged in agreement with the relay position [P2]. The intermediate stage 18 is moved by means of the X-axis movement mechanism 40, whereby the semiconductor chip 6a put on the intermediate stage 18 is placed at the relay position [P2], so that the second camera 22 can capture an image of the semiconductor chip. The position of the semiconductor chip 6a put on the intermediate stage 18 is thereby detected.

The component recognition camera 24 is arranged in such a way that an imaging surface 24a adjoins the intermediate stage 18. The X-axis movement mechanism 40 is moved likewise, whereby the imaging surface 24a can be placed at a component recognition position [P3]. The component recognition camera 24 is used for the case of facedown mounting operation as well as for the case of direct pickup (DAF or the like) operation by means of which the semiconductor chip 6a is picked directly from the component feeding stage 3 by means of the first head 11. In normal face-up mounting operation, a result of recognition performed by the second camera 22 is used by placing emphasis on productivity, and the component recognition camera 24 is not used.

Moreover, a cleaning unit 46 for cleaning the surface of the intermediate stage 18 is placed on the unit collection stage 4. As shown in FIG. 4, the cleaning unit 46 is arranged in such a way that a horizontal rod-shaped cleaning member 46a comes to a position above the intermediate stage 18 while the movement table 4a is situated at a proximal side of the apparatus (i.e., the left side of the apparatus in FIG. 2). A downwardly extending brush 46b is provided on a lower surface of the cleaning member 46a so as to make slidable contact with an upper surface of the intermediate stage 18. The movement table 4a is moved back and forth by moving the X-axis movement mechanism 40 in this state, whereby extraneous matters that adhere in a piled manner to the surface of the intermediate stage 18 are removed by the brush 46b. Suction holes are provided in the cleaning member 46a, and the interior of the cleaning member 46a is subjected to vacuum aspiration (as indicated by arrow "h") by way of a suction pipe 46c, whereby minute extraneous matters eliminated by the brush 46b are sucked and discharged.

The substrate holding stage 5 is provided with the substrate holder table 5a that holds the substrate 7 on the XY table mechanism 53. A mounting work position [P4] for mounting the semiconductor chip 6a on the substrate 7 held by the substrate holder table 5a is set on the substrate holding stage 5, and the third camera 23 is arranged in agreement with the mounting work position [P4]. The third camera 23 detects the position of a component mounting point 7a set on the substrate 7 by capturing an image of the substrate 7 through use of the third camera 23. An XY table mechanism 53 is driven, whereby the substrate holder table 5a is horizontally moved in the XY direction (as indicated by arrow "f") along with the substrate 7, so that an arbitrary component mounting point 7a set on the substrate 7 can be located at the mounting work position [P4].

The first head 11 and the second head 12 will now be described. Two guide rails 9a for guiding the first head 11 and the second head 12 in the direction Y are laid on a front surface of the head movement mechanism 9 provided on the Y-axis frame 8 shown in FIG. 2. A stator 9b making up a linear motor, which will be described later, for moving the first head 11 and the second head 12 in the direction Y is interposed between the guide rails 9a. An un-illustrated slider is fitted to the guide rails 9a so as to be slidable in the direction Y, and the slider is fixed to rear surfaces of vertical movement plates 11a and 12a.

A movable element (omitted from the drawings) that makes up the linear motor while opposing the stator 9b is disposed on the rears of the movement plates 11a and 12a. The first head 11 and the second head 12 are guided along the guide rails 9a by means of driving the linear motor, to thus be respectively moved in the direction Y (as indicated by arrow "d"). A lift mechanism 11b is disposed on a front surface of the movement plate 11a, and a lift mechanism 12b is disposed on a front surface of the movement plate 12a. Further, a lift plate 11c is provided on a front surface of the lift mechanism 11b so as to be vertically slidable, and a lift plate 12c is provided on a front surface of the lift mechanism 12b so as to be vertically slidable. The lift plates 11c and 12c are vertically moved as a result of driving of the lift mechanisms 11b and 12b (as indicated by arrow "e"). The loading unit 19 having at its lower portion a component holding nozzle 19a is removably attached to the lift plate 11c, and two coating units 20 are removably attached to the lift plate 12c.

The loading unit 19 has a function of holding the semiconductor chip 6a, which is a component to be mounted, by means of the component holding nozzle 19a. The first head 11 is horizontally moved in the direction Y, to thus vertically move the lift plate 11c. The loading unit 19 loads the semiconductor chip 6a fed from the component feeding stage 3 on the substrate 7 held by the substrate holding stage 5. Processing pertaining to any one of the following mount modes can be selectively performed as the mount mode of the first head 11 to which the loading unit 19 is attached; namely, a pre-center mount mode (see FIGS. 7 and 8) in which the loading unit 19 holds the semiconductor chip 6a picked from the component feeding stage 3 by means of the pickup head 14 and put on the intermediate stage 18, to thus load the chip on the substrate 7; a direct mount mode (see FIG. 9) in which the loading unit 19 directly holds the semiconductor chip 6a of the component feeding stage 3, thereby loading the chip on the substrate 7; and a facedown mount mode (see FIG. 10) in which the loading unit 19 holds the semiconductor chip 6a, which is picked from the component feeding stage 3 by the pickup head 14 and held by the pickup head 14 while remaining turned inside out, to thus load the chip on the substrate 7.

Specifically, the first head 11 to which the loading unit 19 is attached acts as a first head that receives the semiconductor chip 6a fed by the component feeding stage 3 and put on the intermediate stage 18 by the pickup head 14 or that picks up the semiconductor chip 6a from the component feeding stage 3 and loads the chip on the substrate 7 held by the substrate holding stage 5.

The coating unit 20 attached to the second head 12 is equipped with a syringe 20a that houses paste corresponding to a resin adhesive for component bonding purpose and a coating nozzle 20b that squirts the paste. The second head 12 is moved to a position above the substrate 7 held by the substrate holding stage 5 and causes the coating unit 20 to perform coating operation, whereby the paste squirted from the coating nozzle 20b is applied to the component mounting point 7a on the substrate 7. In addition to the coating unit 20 shown in FIG. 2, the two types of work units; namely, the transfer unit 54 and the heating-press unit 57 to be described below, are selectively attached to the second head 12 according to a mounting mode for the type of a target component.

The work unit selectively attached to the second head 12 will now be described by reference to FIG. 5. FIG. 5A shows a state in which the transfer unit 54 is attached to the second head 12, and FIG. 5B shows a state in which the heating-press unit 57 is attached to the second head 12. The transfer unit 54 has a function of feeding paste 56 to the substrate 7 by means of transfer operation. When a target component is of small size and when the amount of the paste 56 to be fed is small, the transfer unit 54 is selectively attached to the second head 12.

As shown in FIG. 5A, the transfer unit 54 has a transfer tool 54a and is used along with a transfer table 55 that feeds the paste 56 in the form of a transfer film. The transfer table 55 is a substantially-disc-shaped container having a smooth coating film formation surface 55a, and a coating film of the paste 56 for use in bonding a component is made over the coating film formation surface 55a to a predetermined thickness. When the paste 56 is fed by the transfer unit 54 by transfer operation, the transfer tool 54a is first lowered with respect to the transfer table 55, thereby causing the paste 56 to adhere to a lower end portion of the transfer tool 54a. The second head 12 is then moved, thereby moving the transfer unit 54 to a location above the substrate 7 held by the substrate holding table 5a. The transfer tool 54a is lowered, thereby feeding the paste 56 to an upper surface of the substrate 7 by the transfer tool 54a through transfer operation.

The heating-press unit 57 has a function of pressurizing the semiconductor chip 6a, which has been loaded on the substrate 7 by means of the loading unit 19, at predetermined press strength while heating the same. The heating-press unit 57 is used for a case where the semiconductor chip 6a to which a DAF (Die Touch Film) is previously affixed is taken as an object of mounting. As a result of the heating-press unit 57 being previously attached to the second head 12, the second head 12 is immediately moved to the substrate 7 after the first head 11 has loaded the semiconductor chip 6a on the substrate 7 through use of the loading unit 19, as shown in FIG. 5B, so that the semiconductor chip 6a can be heated and pressed while the heating-press tool 57a is brought into contact with the semiconductor chip 6a. As a result, the loading unit 19 can immediately shift to working operation for loading the next semiconductor chip 6a immediately after having loaded the semiconductor chip 6a on the substrate 7. As compared with the case where the loading unit 19 performs all working operations including heating-and-pressing operations, working efficiency can significantly be improved.

Specifically, the second head 12 has a function of subjecting the substrate 7 or the semiconductor chip 6a loaded on the substrate 7 by means of the first head 1 to predetermined operations, such as past coating, paste transfer, heating-press operation, and the like. The first head 11 and the second head 12 alternately obtain access to the work position above the substrate 7. The head movement mechanism 9 provided on the Y-axis frame 8; namely, a linear motor made up of the stator 9b and the movable elements provided on the first head 11 and the second head 12, acts as a common head movement mechanism for moving the first head 11 and the second head 12, to thus respectively cause them to obtain access to the work position on the substrate 7.

The above example configuration provides an example that uses, as the work units replaceably attached to the second head 12, the single-function coating unit 20 individually having a paste coating function of squirting the paste 56 for component bonding purpose from the coating nozzle 20b, to thus supply the paste to the substrate 7, the single-function transfer unit 54 individually having a paste transfer function of transferring the paste 56 with use of the transfer tool 54a, to thus supply the paste to the substrate 7, and the single-function heating-press unit 57 individually having a heating-press function of pressing the semiconductor chip 6a loaded on the substrate 7 against the substrate 7 while heating the chip. However, a multifunction work unit having two of these functions can also be used.

Specifically, in the present invention, the second head 12 can selectively be equipped with the work unit having at least one of the paste coating function, the paste transfer function, and the heating-press function. The component holding nozzle 19a, the transfer tool 54a, and the heating-press tool 57a that are removably attached to the loading unit 19, the transfer unit 54, and the heating-press unit 57 according to the type of a component are housed in the tool stocker 15 arranged on the unit collection stage 4 as mentioned previously (see FIG. 4). By letting the first head 11 and the second head 12 gain access to the tool stocker 15, the component holding nozzle 19a, the transfer tool 54a, and the heating-press tool 57a that are attached to the loading unit 19, the transfer unit 54, and the heating-press unit 57 can be replaced according to the type of a target component.

A configuration of a control system is now described by reference to FIG. 6. In FIG. 6, a control section 60 controls a mechanism section, which will be described below, by way of a mechanism drive section 61. Respective operations for picking the semiconductor chip 6a from the component feeding stage 3 and subsequently loading the thus-picked semiconductor chip 6a on the substrate 7 held by the substrate holding stage 5 are thereby performed. First, the component feeding stage 3, the unit collection stage 4, and the substrate holding stage 5 are controlled, whereby component feeding operation performed by the XY table mechanism 31 and the ejector mechanism 34 in the component feeding stage 3 are controlled; operation of the X-axis movement mechanism 40 on the unit collection stage 4 is controlled; and operation of the XY table mechanism 53 on the substrate holding stage 5 is then controlled.

The head movement mechanism 9, the first head 11, the second head 12, and the pickup head movement mechanism 13 are next controlled, whereby there are performed pickup operation for picking the semiconductor chip 6a from the component feeding stage 3 and mounting operation for transporting, loading, and bonding the thus-picked semiconductor chip 6a to the substrate 7. Specifically, the pickup operation is performed by controlling the pickup head movement mechanism 13, and the first head 11 equipped with the loading unit 19 is controlled in conjunction with the head movement mechanism 9, whereby loading operation for transporting and loading the semiconductor chip 6a to the substrate 7 is performed.

The second head 12 selectively equipped with any of the three types of work units; namely, the coating unit 20, the transfer unit 54, and the heating-press unit 57, is controlled in conjunction with the head movement mechanism 9, whereby there is performed any of the paste coating function of squirting the paste for component bonding purpose from the coating nozzle 20b, to thus supply the paste to the substrate, the paste transfer function of transferring the paste with use of the transfer tool 54a, to thus supply the paste to the substrate 7, and the heating-press function of pressing the semiconductor chip 6a loaded on the substrate 7 against the substrate 7 while heating the chip. Incidentally, when processing pertaining to the paste transfer function is performed, the transfer table 55 is also controlled.

On the occasion of foregoing various operation control, the control section 60 controls the recognition processing section 62, whereby processing for ascertaining results of photographing operations performed by the respective cameras, which will be described below, is performed. A result of photographing performed by the first camera 21 is subjected to recognition processing, whereby the position of the semiconductor chip 6a on the semiconductor wafer 6 held by the component feeding stage 3 is detected. The control section 60 controls the XY table mechanism 31 in accordance with the result of detection, whereby the semiconductor chip 6a to be picked up can be correctly positioned to the pickup operation position [P1]. A result of photographing performed by the second camera 22 is subjected to recognition processing, whereby the position of the semiconductor chip 6a placed on the intermediate stage 18 is detected. The control section 60 controls the first head 11 and the X-axis movement mechanism 40 in accordance with the result of detection, whereby the component holding nozzle 19a can be correctly positioned with respect to the semiconductor chip 6a to be picked up.

A result of photographing performed by the third camera 23 is subjected to recognition processing, whereby the position of the component mounting point 7a on the substrate 7 held by the substrate holding table 5a is detected. The control section 60 controls the XY table mechanism 53 in accordance with the result of detection, whereby the component mounting point 7a is positioned to the mounting work position [P4], and the semiconductor chip 6a held by the component holding nozzle 19a can be correctly loaded at the component mounting point 7a. A result of photographing performed by the component recognition camera 24 is subjected to recognition processing, whereby the location of the semiconductor chip 6a held by the component holding nozzle 19a is detected. During loading operation performed by the loading unit 19, positional correction is made at the time of loading in consideration of the detection result.

The component mounting apparatus 1 is configured as mentioned above, and component mounting operation performed by the component mounting apparatus 1 is described below. First, by reference to FIG. 7, there is described example work operation of the pre-center mounting mode in which the semiconductor chip 6a, which has been picked from the component feeding stage 3 and held face up, is transported to the substrate holding stage 5 by way of the intermediate stage 18 for positional correction purpose, to thus be mounted. The work operation is selected when the semiconductor chip 6a taken as a target is of a type that requires mounting operation of high positional accuracy. In order to supply the substrate 7 with the paste for component mounting purpose by means of draw-coating operation, the second head 12 is equipped with the coating unit 20.

The semiconductor wafer 6 having the plurality of semiconductor chips 6a affixed to the wafer sheet 6b in a face-up position is set on the component feeding stage 3. The ejector mechanism 34 comes into contact with the lower surface of the wafer sheet 6b at the pickup operation position [P1], so that pickup operation is feasible. Further, the substrate 7 that is an object of mounting is held on the substrate holding table 5a provided on the XY table mechanism 53 in the substrate holding stage 5.

When component mounting operation is commenced, the first camera 21 captures an image of the semiconductor wafer 6 at the pickup operation position [P1], whereby the semiconductor chip 6a to be picked is recognized. The XY table mechanism 31 of the component feeding stage 3 is controlled in accordance with the recognition result, whereby the semiconductor chip 6a to be picked up is correctly positioned to the pickup operation position [P1]. Next, the pickup head 14 picks the semiconductor chip 6a and loads the thus-picked chip on the intermediate stage 18 (as indicted by arrow "i").

On the intermediate stage 18 from which the pickup head 14 has left, the second camera 22 captures an image of the semiconductor chip 6a, thereby recognizing the loaded semiconductor chip 6a and detecting positional displacement. The X-axis movement mechanism 40 is controlled in accordance with a recognition result, the semiconductor chip 6a loaded on the intermediate stage 18 is correctly positioned to the relay position [P2]. The X-axis movement mechanism 40 performs positional correction in only the direction X. In the direction Y, positional correction is effected when the loading unit 19 holds the semiconductor chip 6a.

The third camera 23 captures an image of the substrate 7 at the mounting operation position [P4], thereby recognizing the component mounting point 7a that is an object of mounting. The XY table mechanism 53 of the substrate holding stage 5 is controlled in accordance with the recognition result, whereby the component mounting point 7a is correctly positioned at the mounting operation position [P4]. Next, the second head 12 is moved to a position above the substrate 7 on the substrate holding stage 5, and the coating unit 20 is lowered to the substrate 7 (as indicated by arrow "k"), and paste is squirted from the coating nozzle 20b, to thus subject the substrate 7 to draw-coating. Subsequently, the coating unit 20 is caused to recede from the substrate 7, and the third camera 23 captures an image of the substrate 7 at the mounting work position [P4], thereby performing inspection for determining whether the state of the substrate 7 coated with paste is defective or non-defective. The inspection of the coated state is not indispensable and may also be omitted.

Next, the fist head 11 is moved to the intermediate stage 18, where the loading unit 19 is lowered to the loaded semiconductor chip 6a, and the component holding nozzle 19a holds the semiconductor chip 6a. The loading unit 19 holding the semiconductor chip 6a is moved to a position above the substrate holding stage 5, and the loading unit 19 is lowered at the mounting work position [P4] (as indicated by arrow "j"), whereby the thus-held semiconductor chip 6a is loaded on the substrate 7. These operations are alternately performed, whereby efficient production can be attained particularly in case of use of quick-drying paste. Alternatively, the semiconductor chips 6a may also be sequentially mounted after all mounting positions on the substrate 7 have been coated with paste.

Figure 8:
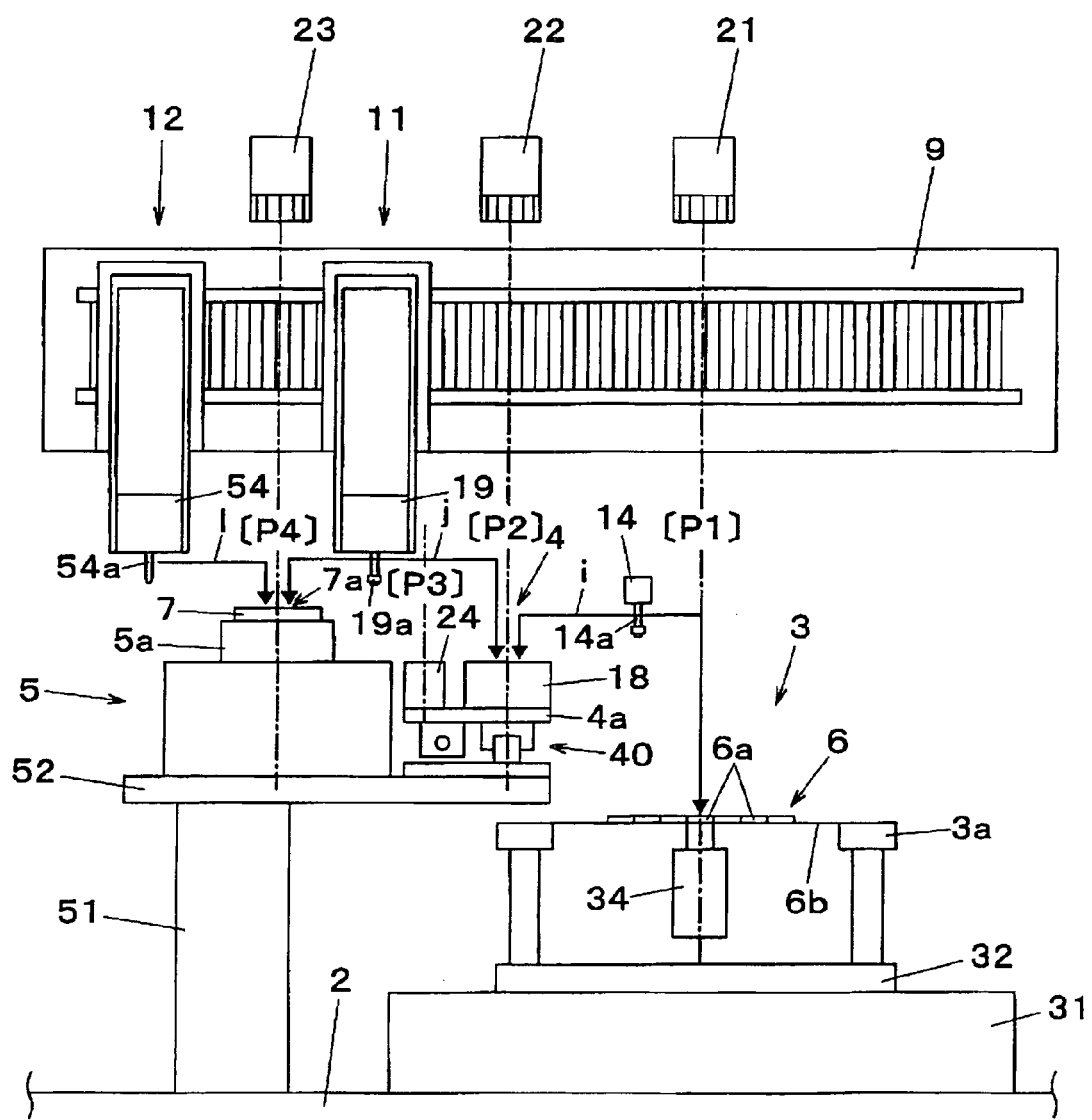
FIG. 8 is a process explanatory view showing a component mounting method of the embodiment of the present invention.

FIG. 8 shows an example case where the small-size semiconductor chip 6a requiring a small amount of paste for component bonding purpose is loaded by way of the foregoing intermediate stage 18. The second head 12 is equipped with the transfer unit 54 shown in FIG. 5A in place of the coating unit 20, and the transfer tool 54a supplies paste to the substrate 7 by means of transfer operation. In this case, the transfer table 55 (see FIG. 5A) is attached to the lower portion of the second head 12, and the transfer tool 54a is first lowered with respect to the transfer unit 54, thereby causing the paste 56 to adhere to the lower end of the transfer tool 54a. Next, the second head 12 is moved to a position above the substrate 7, and the transfer unit 54 is lowered (as indicated by arrow "l"), whereby the paste 56 adhering to the transfer tool 54a is supplied to the substrate 7 by means of transfer operation.

Figure 9:
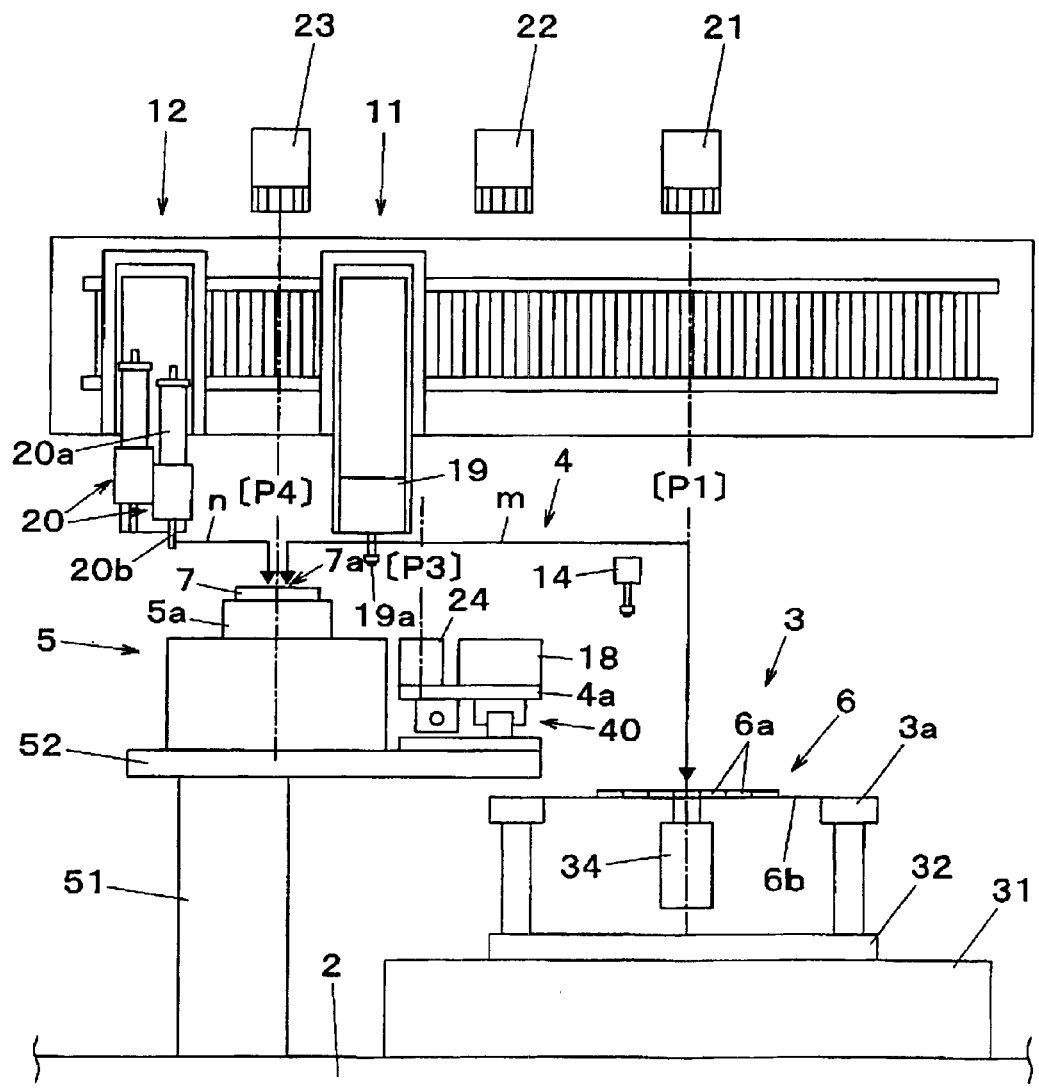
FIG. 9 is a process explanatory view showing a component mounting method of the embodiment of the present invention.

By reference to FIG. 9, there is described example working operation of direct mounting mode in which the semiconductor chip 6a, which has been picked from the component feeding stage 3 by means of the loading unit 19 of the first head 11 and is held in a face-up attitude, is transported directly to the substrate holding stage 5 without passing through the intermediate stage 18, to thus be loaded. In FIG. 9, the semiconductor wafer 6 having the plurality of semiconductor chips 6a in a face-up attitude affixed to the wafer sheet 6b is set on the component feeding stage 3. The ejector mechanism 34 remains in contact with the lower surface of the wafer sheet 6b at the pickup operation position [P1], and pickup operation is feasible. The substrate 7 that is an object of mounting is held on the substrate holding table 5a provided on the XY table 53 on the substrate holding stage 5.

When component mounting operation is commenced, the first camera 21 first captures an image of the semiconductor wafer 6 at the pickup operation position [P1], thereby recognizing the semiconductor chip 6a to be picked up. The XY table 31 of the component feeding stage 3 is controlled in accordance with a result of recognition, thereby correctly positioning the semiconductor chip 6a to be picked up at the pickup operation position [P1]. The third camera 23 captures an image of the substrate 7 at the mounting work position [P4] along with the positioning operation, whereby the component mounting point 7a that is an object of mounting is ascertained. The XY table mechanism 53 of the substrate holding stage 5 is controlled in accordance with a result of ascertainment. Thus, the component mounting point 7a is correctly positioned to the mounting work position [P4].

The loading unit 19 is then moved to a position above the component feeding stage 3, to thus be situated at the pickup operation position [P1]. Next, the loading unit 19 is lowered with respect to the semiconductor wafer 6, thereby holding the semiconductor chip 6a to be picked up by means of the component holding nozzle 19a and exfoliating the chip from the wafer sheet 6b. The coating unit 20 moves to the mounting work position [P4] on the substrate holding stage 5 and descends to the substrate 7 (as indicated by arrow "n"). The coating nozzle 20b is caused to approach the component mounting point 7a of the substrate 7, thereby performing draw-coating of paste. The component mounting point 7a on the substrate 7 is thereby coated with paste component bonding purpose, and the coating unit 20 is subsequently moved to a standby position.

The loading unit 19 whose component holding nozzle 19a holds the semiconductor chip 6a is moved to a position above the substrate holding stage 5 from the pickup operation position [P1], and the loading unit 19 is lowered at the mounting work position [P4], thereby loading the thus-held semiconductor chip 6a on the substrate 7 (as indicated by arrow "m"). When the semiconductor chip 6a is of small size and requires a small amount of paste, the transfer unit 54 may be attached to the second head 12, and paste may be supplied through transfer operation, in place of the foregoing draw-coating operation performed by the coating unit 20, as in the case of the example working operation shown in FIG. 8. Transfer of paste is particularly suitable for a case where placing the semiconductor chip 6a on the intermediate stage 18 is not desired as in the case of DAF mounting.

Figure 10:
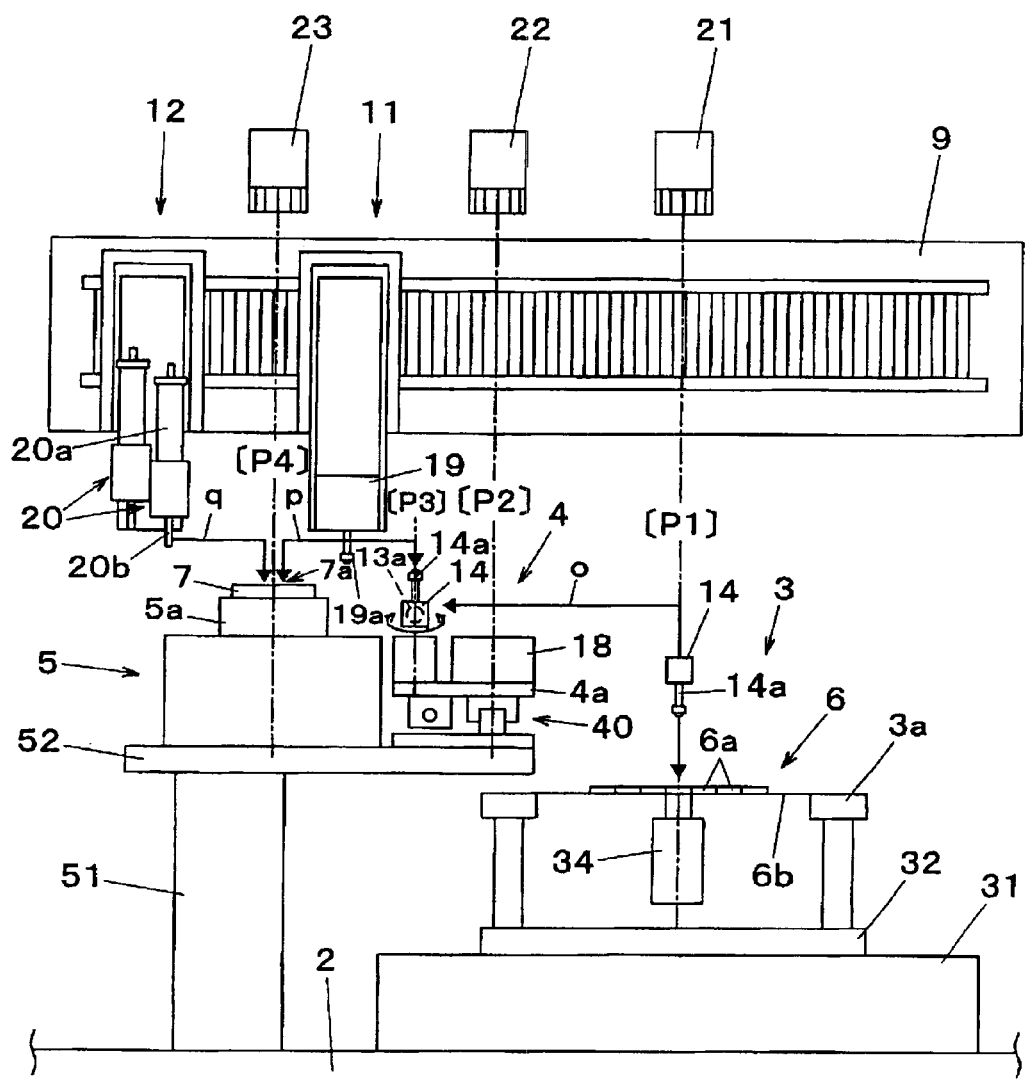
FIG. 10 is a process explanatory view showing a component mounting method of the embodiment of the present invention.

By reference to FIG. 10, there will now be described example working operation of facedown mounting mode in which the semiconductor chip 6a, which has been picked from the component feeding state 3 by means of the pickup head 14 and is held in a face-up attitude, is turned upside down so as to assume a facedown attitude and then transported to the substrate holding stage 5, where the chip is mounted. In FIG. 10, the semiconductor wafer 6 having the plurality of semiconductor chips 6a in a face-up attitude affixed to the wafer sheet 6b is set on the component feeding stage 3. The ejector mechanism 34 remains in contact with the lower surface of the wafer sheet 6b at the pickup operation position [P1]. The substrate 7 that is an object of mounting is held on the substrate holding table 5a provided on the XY table 53 on the substrate holding stage 5.

When component mounting operation is commenced, the first camera 21 first captures an image of the semiconductor wafer 6 at the pickup operation position [P1], thereby recognizing the semiconductor chip 6a to be picked up. The XY table 31 of the component feeding stage 3 is controlled in accordance with a result of recognition, thereby correctly positioning the semiconductor chip 6a to be picked up at the pickup operation position [P1]. The third camera 23 captures an image of the substrate 7 at the mounting work position [P4] along with the positioning operation, whereby the component mounting point 7a that is an object of mounting is ascertained. The XY table 53 of the substrate holding stage 5 is controlled in accordance with a result of ascertainment. Thus, the component mounting point 7a is correctly positioned to the mounting work position [P4].

The pickup head 14 is then moved to a position above the component feeding stage 3, to thus be situated at the pickup operation position [P1]. Next, the pickup head is lowered with respect to the semiconductor wafer 6, thereby holding the semiconductor chip 6a to be picked up by means of the pickup nozzle 14a and exfoliating the chip from the semiconductor wafer 6. Subsequently, the pickup head 6 moves to a position above the unit collection stage 4 while holding the semiconductor chip 6a (as indicated by arrow "o"). An inversion drive section (not shown) incorporated in the pickup head movement mechanism 13 is driven, thereby rotating the pickup head 14 around the pickup arm 13a through an angle of 180°.

The pickup nozzle 14a holding the semiconductor chip 6a is thereby turned upside, whereupon the semiconductor chip 6a assumes a facedown attitude in which an active surface of the chip is downwardly oriented. The coating unit 20 moves to the mounting work position [P4] on the substrate holding stage 5 and descends with respect to the substrate 7 (as indicated by arrow "q"). The coating nozzle 20b is caused to approach the component mounting point 7a of the substrate 7, thereby performing coating operation. The component mounting point 7a of the substrate 7 is coated with underfill paste, and the coating unit 20 is subsequently moved to the standby position. The loading unit 19 moves to a position above the unit collection stage 4, to thus locate at a position immediately above the pickup head 14. The loading unit 19 then descends with respect to the pickup head 14, whereby the component holding nozzle 19a receives the semiconductor chip 6a held by the pickup nozzle 14a in a facedown attitude.

Subsequently, the component recognition camera 24 captures an image of the semiconductor chip 6a held by the component holding nozzle 19a at the component recognition position [P3], thereby ascertaining positional displacement of the semiconductor chip 6a held by the loading unit 19. Next, the first head 11 is moved to a position above the substrate 7, and the loading unit 19 is lowered at the mounting work position [P4], whereby the thus-held semiconductor chip 6a is loaded on the substrate 7 (as indicated by arrow "p"). The positional displacement detected through component recognition performed by the component recognition camera 24 is corrected at this time.

Figure 11:
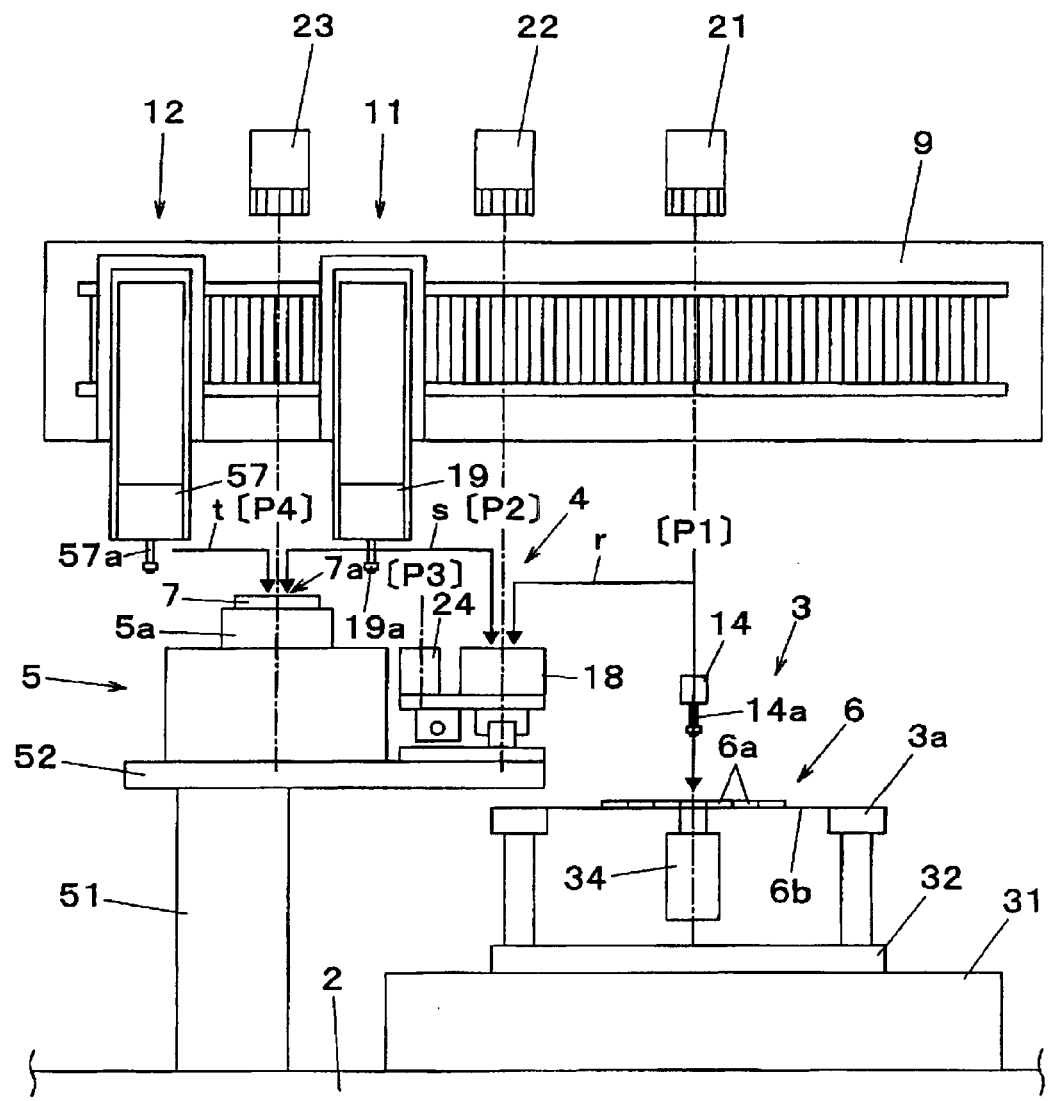
FIG. 11 is a process explanatory view showing a component mounting method of the embodiment of the present invention.

By reference to FIG. 11, there is described an example mounting operation performed when the semiconductor chip 6a to be mounted is a chip whose back surface is previously provided with an affixed DAF (Die Attachment Film) for component bonding purpose. In this case, the second head 12 is equipped with the heating-press unit 57 shown in FIG. 5B, and the second head 12 has a heating-press function of pressing the semiconductor chip 6a loaded on the substrate 7 against the substrate 7 by means of the first head 11 while heating the chip.

The semiconductor wafer 6 having the wafer sheet 6b to which the plurality of semiconductor chips 6a in a face-up attitude are affixed by way of the DAF layer is set on the component feeding stage 3. The ejector mechanism 34 remains in contact with the lower surface of the wafer sheet 6b at the pickup operation position [P1], and pickup operation is feasible. The substrate 7 that is an object of mounting is held on the substrate holding table 5a provided on the XY table 53 on the substrate holding stage 5.

When component mounting operation is commenced, the first camera 21 first captures an image of the semiconductor wafer 6 at the pickup operation position [P1], thereby recognizing the semiconductor chip 6a to be picked up. The XY table 31 of the component feeding stage 3 is controlled in accordance with a result of recognition, thereby correctly positioning the semiconductor chip 6a to be picked up at the pickup operation position [P1]. The pickup head 14 subsequently picks the semiconductor chip 6a along with the DAF layer (a component pickup process), and the component picked from the component feeding stage 3 is placed on the intermediate stage 18 (a component placement process) (as indicated by arrow "r").

The second camera 22 captures an image of the semiconductor chip 6a on the intermediate stage 18 from which the pickup head 14 has left, thereby recognizing the placed semiconductor chip 6a and detecting positional displacement. The X-axis movement mechanism 40 is controlled in accordance with a recognition result, whereby the semiconductor chip 6a placed on the intermediate stage 18 is correctly positioned at the relay position [P2]. The X-axis movement mechanism 40 performs positional correction in only the direction X. In the direction Y, positional correction is performed when the loading unit 19 holds the semiconductor chip 6a.

The third camera 23 captures an image of the substrate 7 at the mounting work position [P4], whereby the component mounting point 7a that is an object of mounting is recognized. The XY table 53 of the substrate holding stage 53 is controlled in accordance with a recognition result, whereby the component mounting point 7a is correctly positioned at the mounting work position [P4]. Next, the first head 11 is moved to the intermediate stage 18, and the loading unit 19 receives the semiconductor chip 6a placed on the intermediate stage 18. The chip is positioned to the substrate 7 held by the substrate holding stage 5 and loaded (a component loading process). Specifically, the loading unit 19 is lowered with respect to the semiconductor chip 6a placed on the intermediate stage 18, and the semiconductor chip 6a is held by the component holding nozzle 19a. the loading unit 19 holding the semiconductor chip 6a is moved to a position above the substrate holding stage 5, and the loading unit 19 is lowered at the mounting work position [P4] (as indicated by arrow "s"), thereby loading the thus-held semiconductor chip 6a on the substrate 7.

Subsequently, when the first head 11 has left from the position above the substrate 7 as a result of ascending action of the loading unit 19, the second head 12 is moved by the common head movement mechanism 9 for the first head 11. The second head 12 to which is attached the heating-press unit 57 having the heating-press function, presses against the substrate 7 the semiconductor chip 6a loaded on the substrate 7 by the first head 11 while heating the chip (a heating-press process). Specifically, the second head 12 equipped with the heating-press unit 57 is moved to a position above the substrate 7, and the heating-press unit 57 is then lowered, thereby performing crimping operation for heating and pressing the semiconductor chip 6a by means of the heating-press tool 57a (see FIG. 5B). This state is continually held for a predetermined period of time, whereby the semiconductor chip 6a is fixed to the substrate 7 by means of an adhesive layer whose DAF layer has been thermally set. Thus, mounting operation is completed.

During mounting work operation, the loading unit 19 does not need to perform operation for heating and pressing the semiconductor chip 6a. Therefore, the loading unit 19 immediately moves to the intermediate stage 18 after the semiconductor chip 6a has been loaded on the substrate 7 and can shift to operation for receiving the next semiconductor chip 6a. The loading unit 19 received the semiconductor chip 6a waits at close range until the crimping operation performed by the heating-press unit 57 is completed. Immediately after completion of crimping operation, the semiconductor chip 6a is loaded on the substrate 7. Even when the type of a component that consumes a time to perform crimping operation for thermally setting the DAF layer is taken as an object, high production efficiency can be attained.

The foregoing example provides an example pre-center mounting mode in which the holding unit 19 receives the semiconductor chip 6a that has been picked from the component feeding stage 3 by the pickup head 14 and loaded on the intermediate stage 18. A direct mounting mode in which the first head 11 is moved to a position above the component feeding stage 3 and in which the loading unit 19 picks the semiconductor chip 6a directly from the component feeding stage 3 may also be adopted. In this case, the component pickup process, the component placement process, and the component loading process of the mode are replaced with a component pickup process of picking the semiconductor chip 6a from the component feeding stage 3 by means of the first head 11 and the component loading process of positioning and loading the thus-picked semiconductor chip 6a to the substrate 7 held by the substrate holding stage 5 by means of the first head 11.

As shown in FIGS. 7 through 11, under the component mounting method for mounting a plurality of types of components, such as the semiconductor chips 6a, on the substrate 7 by means of a single component mounting apparatus 1, the second head 12 is selectively equipped with a work unit according to the type of a component, to thus perform predetermined operation, wherein the work unit having at least any one of the paste coating function of squirting the paste 56 for component bonding purpose from the coating nozzle 20b, to thus supply the paste to the substrate 7; the paste transfer function of transferring the paste 56 by means of the transfer tool 54a, to thus supply the paste to the substrate 7; and the heating-press function of pressing against the substrate 7 the semiconductor chip 6a loaded on the substrate 7 while heating the chip.

Tool replacement operation performed in a process of continually performance of component mounting operation is now described by reference to FIGS. 12, 13, and 14. The tool replacement operation is for replacing each of the work units attached to the first head 11 and the second head 12 with another work tool compliant with the type of a component every time the type of a component that becomes an object of mounting operation is switched.

Figure 7:
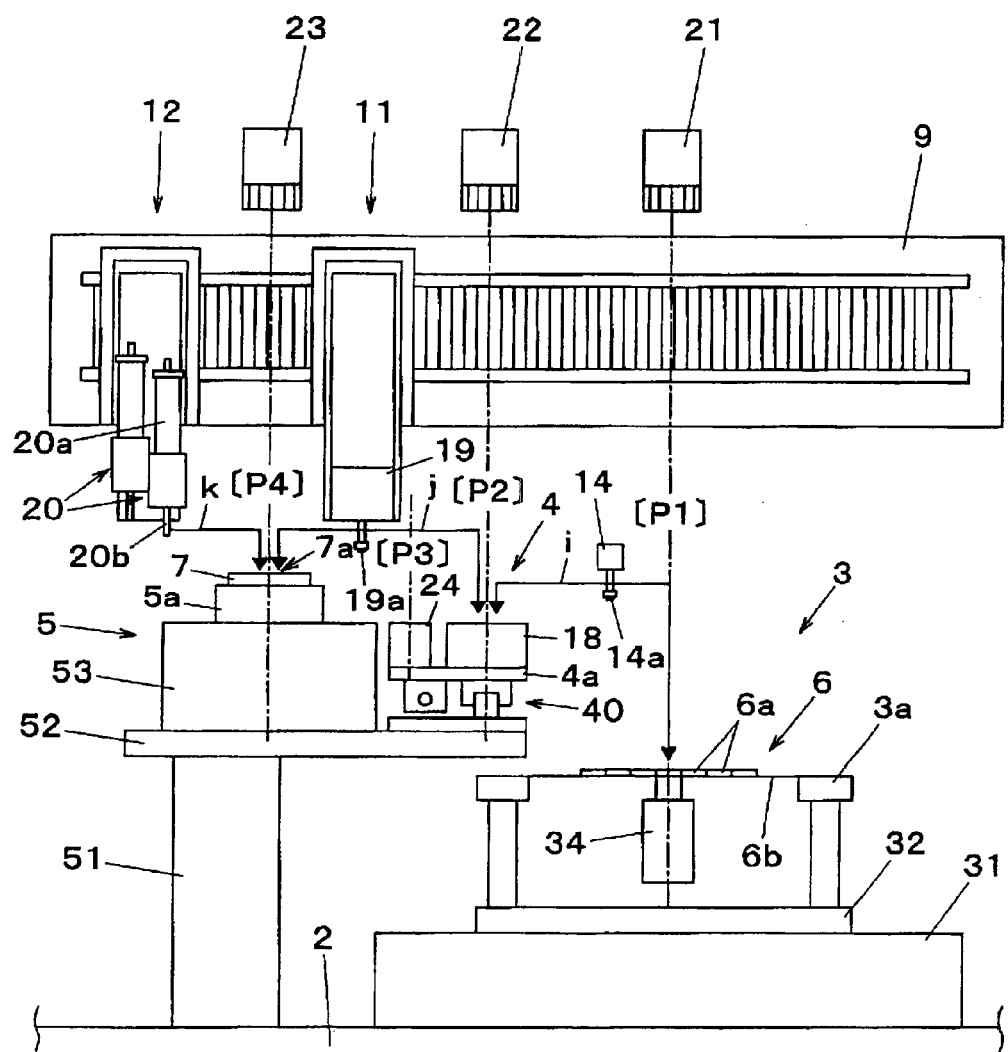
FIG. 7 is a process explanatory view showing a component mounting method of the embodiment of the present invention.

First, FIG. 12 shows tool replacement operation for replacing the pickup nozzle 14a of the pickup head 14 and the component holding nozzle 19a of the loading unit 19 in the example mounting operation shown in FIGS. 7 and 10. Specifically, when the type of a component is changed during mounting operation, the first head 11 equipped with the pickup head 14 and the loading unit 19 is caused to sequentially make access to the tool stoker 15 where the pickup nozzle 14a and the component holding nozzle 19a are housed. The pickup head 14 and the loading unit 19 are subjected to tool replacement operation, whereby either the pickup head 14 or the loading unit 19 or both the pickup head 14 and the loading unit 19 are equipped with the pickup nozzle 14a and the component holding nozzle 19a compliant with the type of a new component as required.

FIG. 13 shows tool replacement operation for replacing, in the example mounting operation shown in FIG. 8, the transfer tool 54a of the transfer unit 54 in addition to replacing the pickup nozzle 14a of the pickup head 14 and the component holding nozzle 19a of the loading unit 19. Specifically, when the type of a component is changed during mounting operation, the first head 11 equipped with the pickup head 14 and the loading unit 19 and the second head 12 equipped with the transfer unit 54 are caused to sequentially make access to the tool stoker 15 where the pickup nozzle 14a, the component holding nozzle 19a, and the transfer tool 54a are housed. The pickup head 14, the loading unit 19, and the transfer unit 54 are subjected to tool replacement operation, whereby any one of or all the pickup head 14, the loading unit 19, and the transfer unit 54 are equipped with the pickup nozzle 14a, the component holding nozzle 19a, and the transfer tool 54a compliant with the type of a new component as required.

FIG. 14 shows tool replacement operation for replacing, in the example mounting operation shown in FIG. 8, the heating-press tool 57a of the heating-press unit 57 in addition to replacing the pickup nozzle 14a of the pickup head 14 and the component holding nozzle 19a of the loading unit 19. Specifically, when the type of a component is changed during mounting operation, the first head 11 equipped with the pickup head 14 and the loading unit 19 and the second head 12 equipped with the heating-press unit 57 are caused to sequentially make access to the tool stoker 15 where the pickup nozzle 14a, the component holding nozzle 19a, and the heating-press tool 57a are housed. The pickup head 14, the loading unit 19, and the heating-press unit 57 are subjected to tool replacement operation, whereby any one of or all the pickup head 14, the loading unit 19, and the heating-press unit 57 are equipped with the pickup nozzle 14a, the component holding nozzle 19a, and the heating-press tool 57a compliant with the type of a new component as required.

Specifically, in the example operation, when the component type of the semiconductor chip 6a is changed, the component holding nozzle 19a and/or the heating-press tool 57a is replaced by means of letting the first head 11 and the second head 12 make access to the tool stoker 15 that is provided integrally with the intermediate stage 18 at the position where both the first head 11 and the second head 12 can make access and that houses the component holding nozzle 19a to be replaceably attached to the first head 11 according to the type of the semiconductor chip 6a serving as a target and the heating-press tool 57a to be replaceably attached to the second head 12 according to the type of the semiconductor chip 6a serving as a target.

As described above, in addition to including the first head 11 having a function of loading the semiconductor chip 6a on the substrate 7 held by the substrate holding stage 5, the component mounting apparatus 1 shown in the embodiment is configured to have the second head 12 for subjecting the substrate 7 or the semiconductor chip 6a loaded on the substrate 7 by the first head 11 to predetermined operation. Further, the component mounting apparatus is configured so as to be able to selectively provide the second head 12 with a work unit having at least one of the paste coating function, the paste transfer function, and the heating-press function. The single apparatus can thereby address a variety of mounting modes and enhance versatility and productivity.

The component mounting apparatus of the present invention has a characteristic of being able to enhance productivity as well as versatility and can be utilized in a field where a component is mounted on a leadframe, a resin substrate, and the like.

What is claimed is:

1. A component mounting method for mounting a plurality of types of components on a substrate, said method comprising:

providing a component mounting apparatus comprising a component feeding stage supplying a component; a substrate holding stage holding a substrate; a first head that receives the component fed from the component feeding stage and that loads the component on a substrate held by the substrate holding stage; a second head that subjects the substrate or the component loaded on the substrate by the first head to a predetermined operation; a common head movement mechanism that moves the first head and the second head so as to alternately make access to a work position on the substrate; a paste coating unit for squirting paste from an associated coating nozzle to apply the paste to the substrate; a paste transfer unit for transferring paste by an associated transfer tool to the substrate; and a heating-press unit for pressing the component loaded on the substrate against the substrate while heating the component, selecting a work unit from the paste coating unit, the paste transfer unit and the heating-press unit in accordance with the type of a component to be mounted on the substrate, and equipping the second head with the selected work unit.

* * * * *